(12) United States Patent
Murata et al.

(10) Patent No.: US 8,586,969 B2
(45) Date of Patent: Nov. 19, 2013

(54) ORGANIC EL DEVICE

(75) Inventors: Hideyuki Murata, Ishikawa (JP);
Toshinori Matsushima, Ishikawa (JP)

(73) Assignee: Japan Advanced Institute of Science and Technology, Ishikawa (JP)

( * ) Notice: Subject to any disclaimer, the term of this patent is extended or adjusted under 35 U.S.C. 154(b) by 422 days.

(21) Appl. No.: 12/741,285

(22) PCT Filed: Nov. 11, 2008

(86) PCT No.: PCT/JP2008/070497
§ 371 (c)(1),
(2), (4) Date: May 4, 2010

(87) PCT Pub. No.: WO2009/063859
PCT Pub. Date: May 22, 2009

(65) Prior Publication Data
US 2010/0264407 A1    Oct. 21, 2010

(30) Foreign Application Priority Data
Nov. 13, 2007    (JP) .................................. 2007-294452

(51) Int. Cl.
*H01L 51/54* (2006.01)

(52) U.S. Cl.
USPC ..................................... 257/40; 257/E51.027

(58) Field of Classification Search
USPC .............................. 257/40, E51.027; 349/69
See application file for complete search history.

(56) References Cited

U.S. PATENT DOCUMENTS

| 7,183,707 B2 | 2/2007 | Tyan et al. | |
| 2004/0258954 A1* | 12/2004 | Takasu et al. | 428/690 |
| 2005/0162075 A1* | 7/2005 | Madathil et al. | 313/504 |
| 2006/0158098 A1* | 7/2006 | Raychaudhuri et al. | 313/503 |
| 2006/0159955 A1 | 7/2006 | Inoue et al. | |
| 2006/0279206 A1 | 12/2006 | Noriyuki et al. | |
| 2007/0222379 A1 | 9/2007 | Yamazaki et al. | |
| 2007/0241665 A1* | 10/2007 | Sakanoue et al. | 313/503 |
| 2007/0290604 A1* | 12/2007 | Sakanoue et al. | 313/503 |
| 2008/0258610 A1* | 10/2008 | Ikeda et al. | 313/504 |
| 2008/0278067 A1* | 11/2008 | Tyan et al. | 313/504 |

FOREIGN PATENT DOCUMENTS

| CN | 1781912 | 6/2006 |
| EP | 1 734 794 | 12/2006 |
| JP | 2005-032618 A | 2/2005 |
| JP | 2006-005340 | 1/2006 |

(Continued)

OTHER PUBLICATIONS

Tokito, S. et al. "Metal oxides as a hole-injecting layer for an organic electroluminescent device", Journal of Physics D: Applied Physics, vol. 29, 1996, pp. 2750-2753.

(Continued)

*Primary Examiner* — Caridad Everhart
(74) *Attorney, Agent, or Firm* — Hamre, Schumann, Mueller & Larson, P.C.

(57) ABSTRACT

The organic EL device of the present invention includes an anode, a cathode (e.g., an Al layer (15)), and an organic layer 20 that is disposed between the anode and the cathode and that includes a light emitting layer 14. At least one side of the anode nearer to the organic layer (20) is formed of a transparent oxide semiconductor layer (e.g., an ITO layer (12)). The molybdenum oxide layer is disposed between the oxide semiconductor layer and the organic layer (20). The thickness of the molybdenum oxide layer is less than 2 nm when the molybdenum oxide layer is assumed to have a uniform thickness.

6 Claims, 14 Drawing Sheets

(56) References Cited

FOREIGN PATENT DOCUMENTS

| JP | 2006-344774 A | 12/2006 |
| JP | 2007-149703 | 6/2007 |
| JP | 2007-533104 A | 11/2007 |
| WO | 01/15244 | 3/2001 |

OTHER PUBLICATIONS

Miyashita, T. et al. "Dual Drive and Emission Panel", Japanese Jouranl of Applied Physics, vol. 44, No. 6A, 2005, pp. 3682-3685.

Chen, C. et al. "Effective connecting architecture for tandem organic light-emitting devices", Applied Physics Letters. vol. 87, 2005, pp. 241121.

Satoh, R. et al. "Top-Emission Organic Light-Emitting Diodes with Ink-Jet Printed Self-Aligned Emission Zones", Japanese Journal of Applied Physics, vol. 45, No. 3A, 2006, pp. 1829-1831.

You, H. et al. "Improved Performances of organic light-emitting diodes with metal oxide as anode buffer", Journal of Applied Physics, vol. 101, 2007, pp. 026105.

Chen, et al., "OLED Organic Electroluminescent Materials & Devices", Tsinghua University Press, p. 45, 2007.

\* cited by examiner

ORGANIC EL DEVICE

TECHNICAL FIELD

The present invention relates to organic EL devices.

BACKGROUND ART

Organic EL devices have received a great deal of attention because they can be used to produce displays and light sources that have the advantage of being flexible, thin, and lightweight. However, organic EL devices still have many problems, and further improvement in their characteristics is desired in order to expand their use.

As one of techniques for improving the characteristics of organic EL devices, a technique of interposing a hole-injection layer at the interface between an anode and a hole-transport layer has been known. In addition, it has been reported that the characteristics can be improved by using a $MoO_3$ layer as the hole-injection layer. Such information is disclosed in JP 2005-32618 A and JP 2006-344774 A. Moreover, S. Tokito et al. also reported such information (J. Phys. D: Appl. Phys., 29, 2750 (1996)). Moreover, T. Miyashita et al. also reported such information (Jpn. J. Appl. Phys., 44, 3682 (2005)). Moreover, C.-W. Chen et al. also reported such information (Appl. Phys. Lett., 87, 241121 (2005)). Moreover, R. Satoh et al. also reported such information (Jpn. J. Appl. Phys., 45, 1829 (2006)). Moreover, H. You et al. also reported such information (J. Appl. Phys., 101, 026105 (2007)). The thicknesses of $MoO_3$ layers that generally have been used were in a range of 2 to 50 nm.

The object of the invention disclosed in JP 2006-344774 A is to increase the brightness and to reduce the power consumption of an organic EL device. JP 2006-344774 A discloses a top emission type organic EL device that emits light from the side opposite to a substrate. In this organic EL device, an anode formed of aluminum, an organic layer, and a cathode formed of ITO are stacked on the substrate in this order. The light generated in the organic layer is emitted outward through the cathode. A Mo oxide layer (thickness is, for example, 3.5 to 1000 angstroms) is disposed between the anode and the organic layer. In the case where the anode of the top emission type organic EL device mentioned above includes a transparent electrode such as ITO, the light heading for the anode from the light emitting layer passes through the transparent electrode twice before exiting the device. Because of this, JP 2006-344774 A teaches that when the top emission type organic EL device mentioned above includes a transparent electrode such as ITO, the optical absorption of the transparent electrode becomes a problem (paragraph [0004] of JP 2006-344774 A). Moreover, JP 2006-344774 A teaches that an anode formed of ITO causes a problem in that the current density decreases (paragraph [0005] of JP 2006-344774 A).

DISCLOSURE OF THE INVENTION

There is now a need to extend the life of organic EL devices. With the foregoing background in mind, it is an object of the present invention to provide an organic EL device having a long life.

The present inventors found that the insertion of an extremely thin molybdenum oxide layer between a transparent oxide semiconductor layer (anode) and an organic layer provides an outstanding effect completely different from the effect that had been known as the effect of the molybdenum oxide layer. The present invention is based on this new finding.

In order to achieve the above object, a first aspect of the present invention provides an organic EL device including: an anode; a cathode; and an organic layer, the organic layer being disposed between the anode and the cathode and including a light emitting layer, wherein at least one side of the anode nearer to the organic layer is formed of a transparent oxide semiconductor layer, a molybdenum oxide layer is disposed between the oxide semiconductor layer and the organic layer, and when the molybdenum oxide layer is assumed to have a uniform thickness, the thickness of the molybdenum oxide layer is less than 2 nm.

A second aspect of the present invention provides an organic EL device including: an anode; a cathode; and an organic layer, the organic layer being disposed between the anode and the cathode and including a light emitting layer, wherein at least one side of the anode nearer to the organic layer is formed of a transparent oxide semiconductor layer, and a molybdenum oxide layer is formed nonuniformly at the interface between the oxide semiconductor layer and the organic layer so that the oxide semiconductor layer is partially in contact with the organic layer.

The present invention provides an organic EL device having a long life.

BEST MODE FOR CARRYING OUT THE INVENTION

Figure 1A:
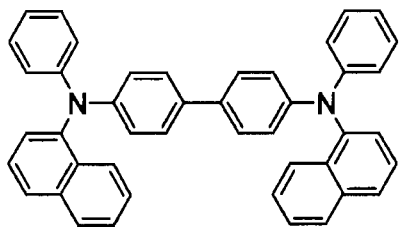
FIGS. 1A to 1E show the structures of compounds used in Examples 1 to 5.

Embodiments of the present invention are described below. The present invention is not limited to the following embodiments and the following examples. In the description below, a specific value or a specific material may be mentioned as an example. However, other values and other materials can be applied as long as an advantageous effect of the present invention can be achieved.

[Organic EL Device]

The items common to both the first and second aspects of the organic EL device according to the present invention are described below. The organic EL device of the present invention includes an anode, a cathode, and an organic layer. The organic layer is disposed between the anode and the cathode, and includes a light emitting layer. Of the anode, at least one side nearer to the organic layer is formed of a transparent oxide semiconductor layer (a translucent oxide semiconductor layer). A molybdenum oxide layer is disposed between the oxide semiconductor layer and the organic layer. That is, the organic EL device of the present invention includes a layered structure of the oxide semiconductor layer/the molybdenum oxide layer/the organic layer. In a typical embodiment, the molybdenum oxide layer is formed nonuniformly, and the oxide semiconductor layer is partially in contact with the organic layer at the interface between the oxide semiconductor layer and the organic layer.

Preferred examples of the oxide semiconductors include indium tin oxide (ITO), aluminum-doped zinc oxide (AZO), and indium-doped zinc oxide (IZO). Films formed of such materials may be called transparent conductive films. Among them, ITO is preferred because of its good characteristics.

The anode is an electrode for injecting holes. The anode may be composed only of an oxide semiconductor layer. A typical example of the anode is formed only of ITO, or formed only of aluminum-doped zinc oxide (AZO), or formed only of indium-doped zinc oxide (IZO). The anode may be formed of a plurality of layers. For example, the anode may include a metal layer (e.g., an aluminum layer) and an oxide semiconductor layer (e.g., an AZO layer, an IZO layer, or an ITO layer) formed on the metal layer.

The organic layer substantially is formed of organic compounds. However, inorganic compounds (dopant etc.) may be added to the organic layer.

The organic layer may include other layers besides the light emitting layer. For example, the organic layer may include at least one layer selected from the group consisting of hole-transport layers, electron-transport layers, and electron-injection layers. The molybdenum oxide layer is believed to serve as a hole-injection layer. However, the organic EL device of the present invention may include other hole-injection layers besides the molybdenum oxide layer as long as an advantageous effect of the present invention can be achieved. Those layers are stacked so that the anode, the hole-injection layer, the hole-transport layer, the light emitting layer, the electron-transport layer, the electron-injection layer, and the cathode are stacked in this order. It should be noted that layers other than the anode (which includes the oxide semiconductor layer), the cathode and the light emitting layer can be omitted in some cases. These layers may be stacked in sequence from the anode or from the cathode on a substrate. The substrate is, for example, a transparent substrate (e.g., glass substrate). As long as an advantageous effect of the present invention can be achieved, materials of these layers are not particularly limited. For example, organic materials known in the art can be used.

When the light generated in the light emitting layer is emitted through the substrate, a substrate formed of a transparent material (a translucent material) is used. For example, a glass substrate and a resin substrate such as a polyimide substrate can be used. When the light generated in the light emitting layer is emitted from the side opposite to the substrate, the substrate may or may not be transparent.

Aromatic amine derivatives can be used to form the hole-transport layer. Examples of materials that can be used to form the hole-transport layer include triphenylamine derivatives (e.g., TPD, alpha-NPD, beta-NPD, MeO-TPD, or TAPC), phenylamine tetramers (TPTE), starburst-type triphenylamine derivatives (e.g., m-MTDADA, NATA, 1-TNATA, or 2-TNATA), spiro-type triphenylamine derivatives (e.g., Spiro-TPD, Spiro-NPD, or Spiro-TAD), rubrene, pentacene, copper phthalocyanine (CuPc), titanium oxide phthalocyanine (TiOPc), and alpha-sexithiophene (alpha-6T). Examples of materials that can be used to form the light emitting layer include 8-quinolinol aluminum complex (Alq$_3$), carbazole derivatives (e.g., MCP, CBP, or TCTA), triphenylsilyl derivatives (e.g., UGH2 or UGH3), iridium complexes (e.g., Ir(ppy)$_3$Ir(ppy)$_2$(acac), FIrPic, Fir6, Ir(piq)$_3$, or Ir(btp)$_2$(acac)), rubrene, coumarin derivatives (e.g., Coumarin6 or C545T), quinacridone derivatives (e.g., DMQA), pyran derivatives (e.g., DCJTB), and europium complexes (e.g., Eu(dbm)3 (phen)). Examples of materials that can be used to form the electron-transport layer include quinolinol complexes (e.g., Alq$_3$, BAlq, or Liq), oxadiazole derivatives (e.g., OXD-7 or PBD), triazole derivatives (e.g., TAZ), phenanthroline derivatives (e.g., BCP or BPhen), and phosphorus oxide derivatives (e.g., POPy$_2$). Examples of organic compounds that can be used to form the electron-injection layer include lithium phenanthridionate (Liph). These materials can be chosen and combined taking their characteristics into consideration. When a compound is used in different devices having different structures, the compound may form layers that play different roles in the different devices. For example, Alq$_3$ may form a light emitting layer, may form an electron-transport layer, and may form a layer that serves as both a light emitting layer and an electron-transport layer.

The organic EL device of the present invention may include an inorganic layer formed of an inorganic material. The inorganic layer may be disposed between the layers that constitute the organic layer, or may be disposed between the organic layer and the electrode (the anode and/or the cathode). For example, the electron-injection layer may be formed of an inorganic material. Examples of inorganic materials that can be used to form the electron-injection layer include lithium, cesium, barium, calcium, sodium, magnesium, lithium fluoride, cesium fluoride, lithium oxide, and cesium carbonate (Cs$_2$CO$_3$).

The cathode is an electrode for injecting electrons. The cathode may be formed of a conductive material, for example, metals such as aluminum, silver, neodymium-aluminum alloy, gold-aluminum alloy, and magnesium-silver alloy. The cathode may be formed of a plurality of layers.

In a typical embodiment of the present invention, the light generated in the light emitting layer is emitted from the anode. However, the light generated in the light emitting layer may be emitted from the cathode as long as an advantageous effect of the present invention can be achieved. In this case, the cathode is formed of a transparent conductive material (e.g., the oxide semiconductors mentioned above).

In an embodiment of the organic EL device according to the present invention, the layer that is included in the organic layer and that is adjacent to the anode (the layer nearest to the anode, in the organic layer) is the hole-transport layer. In this case, the molybdenum oxide layer is disposed between the anode and the hole-transport layer. In another embodiment of the organic EL device according to the present invention, the layer that is included in the organic layer and that is adjacent to the anode is the light emitting layer. In this case, the molybdenum oxide layer is disposed between the anode and the light emitting layer. In an embodiment of the organic EL device according to the present invention, the organic layer includes a hole-transport layer adjacent to the anode, and the hole-transport layer is formed of alpha-NPD. In this case, the organic layer includes a layer that is nearest to the anode among the layers constituting the organic layer and that is formed of alpha-NPD. Alternatively, among layers constituting the organic layer, a layer nearest to the anode may be formed of any one selected from the group consisting of alpha-NPD, TPD, 2-TNATA, alpha-6T, and CuPc, or may be formed of at least one selected from the group consisting of these compounds.

The molybdenum oxide layer may be formed of molybdenum trioxide ($MoO_3$). The molybdenum oxide layer may be formed of molybdenum oxide that is represented by a composition formula: $MoO_x$. In an embodiment, "x" in $MoO_x$ satisfies $2.1 \leq x \leq 3.0$ (e.g., $2.5 \leq x \leq 3.0$). Furthermore, "x" in $MoO_x$ may be not less than 2.6, or not less than 2.7, and may be less than 3. In this specification, $MoO_x$ layers whose x values are 3 when rounded off may be referred to as molybdenum trioxide layers.

The molybdenum trioxide layer can be formed by vapor phase deposition methods, such as vacuum deposition methods using $MoO_3$ as the evaporation source and sputtering methods. It should be noted that when a molybdenum trioxide layer is formed by a vacuum deposition method using $MoO_3$ as the evaporation source, the oxygen content of the resultant molybdenum oxide layer may become lower than the oxygen content of the deposition source (i.e., $MoO_3$), and thereby the molybdenum oxide layer represented by the above-mentioned $MoO_x$ may be formed.

[Method of Manufacturing the Organic EL Device]

The method of manufacturing the organic EL device of the present invention is not limited. For example, the organic EL device may be manufactured by methods known in the art. The organic layers and the inorganic layers may be formed by vapor phase deposition methods, such as vacuum deposition methods and sputtering methods. Alternatively, organic layers may be formed by applying a solution containing organic materials.

[Molybdenum Oxide Layer in the Organic EL Device According to the First Aspect of the Present Invention]

The organic EL device according to the first aspect of the present invention is characterized in that the thickness of the molybdenum oxide layer is less than 2 nm when the thickness of the molybdenum oxide layer is assumed to have a uniform thickness. The thickness of the molybdenum oxide layer calculated on the assumption that the thickness of the molybdenum oxide layer is uniform may be referred to as "virtual thickness." The virtual thickness may be not less than 0.25, or not less than 0.5 nm, and may be not more than 1.5 nm, or not more than 1 nm. For example, the virtual thickness may be not less than 0.25 nm and less than 2 nm. In a preferred embodiment, the virtual thickness is not less than 0.25 nm and not more than 1 nm.

The molybdenum oxide layer may be formed by vapor phase deposition methods, such as vacuum deposition methods and sputtering methods. In some cases, it may be difficult to form a molybdenum oxide layer while measuring the thickness thereof. Because of this, when a molybdenum oxide layer is formed by vapor deposition methods, the thickness of the molybdenum oxide layer may be controlled as follows. First, the deposition rate is measured in advance. Next, necessary deposition time is calculated using the deposition rate. And a deposition of molybdenum oxide is conducted for only the calculated deposition time, thereby controlling the thickness of the molybdenum oxide layer. In Examples described below, the thickness of the molybdenum oxide layer estimated with this method is referred to as "virtual thickness."

In the organic EL device according to the first aspect of the present invention, the molybdenum oxide layer is formed at the interface between the oxide semiconductor layer and the organic layer. The molybdenum oxide layer may be formed nonuniformly at the interface between the oxide semiconductor layer and the organic layer so that the oxide semiconductor layer is partially in contact with the organic layer. Examples of how the molybdenum oxide layer is formed nonuniformly will be described in the following description of the organic EL device according to the second aspect.

[Molybdenum Oxide Layer in the Organic EL Device According to the Second Aspect]

The organic EL device according to the second aspect of the present invention is characterized in that the molybdenum oxide layer is formed nonuniformly at the interface between the oxide semiconductor layer and the organic layer so that the oxide semiconductor layer is partially in contact with the organic layer.

In the organic EL device of the second aspect, the molybdenum oxide layer is formed nonuniformly at the interface between the oxide semiconductor layer and the organic layer. That is, in the organic EL device of the second aspect, the molybdenum oxide layer is not formed on the entire interface between the oxide semiconductor layer and the organic layer, but is formed on part of the interface. The molybdenum oxide layer may be formed like islands on the interface (i.e., a surface of the oxide semiconductor layer) between the oxide semiconductor layer and the organic layer. The regions on which the molybdenum oxide layer is formed and the regions on which the molybdenum oxide layer is not formed may form a patchy pattern.

In the organic EL device of the second aspect, it is preferred that the regions on which the molybdenum oxide layer is formed be distributed uniformly. For example, it is preferred that the regions on which the molybdenum oxide layer is formed and the regions on which the molybdenum oxide layer is not formed be distributed uniformly so that both of the regions are included in any area of 10 μm square (preferably 0.5 μm square) at the interface between the oxide semiconductor layer and the organic layer.

Since the molybdenum oxide layer is formed nonuniformly, the thickness thereof is not constant. However, when the nonuniform molybdenum oxide layer is assumed to be flattened to have a uniform thickness, the resultant thickness (above-mentioned "virtual thickness") of the molybdenum oxide layer is less than 2 nm. The virtual thickness may be not less than 0.25 nm, or not less than 0.5 nm, and may be not more than 1.5 nm, or not more than 1 nm. For example, the virtual thickness may be not less than 0.25 nm and less than 2 nm. A preferred example of the virtual thickness is not less than 0.25 nm and not more than 1 nm.

In the organic EL device of the second aspect, it is important that the molybdenum oxide layer be formed so as not to cover the entire area of the surface of the anode. Although details are still not clear, it is believed that an outstanding effect can be achieved when the molybdenum oxide layer is present in a patchy pattern on the surface of the anode. It is therefore believed to be important for the molybdenum oxide layer to be made extremely thin so that the molybdenum oxide layer will not be a uniform layer.

In manufacturing the organic EL device of the second aspect, the method of forming the molybdenum oxide layer is not particularly limited as long as the molybdenum oxide layer can be formed nonuniformly. The molybdenum oxide layer may be formed by vapor phase deposition methods, such as vacuum depositions and sputtering methods. It is believed that when a thin layer (e.g., 1 nm or less in thickness) is formed by vacuum deposition methods, the layer will be nonuniform.

EXAMPLES

Figure 1D:
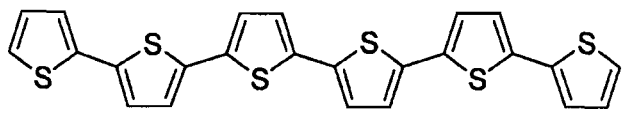
Figure 1B:
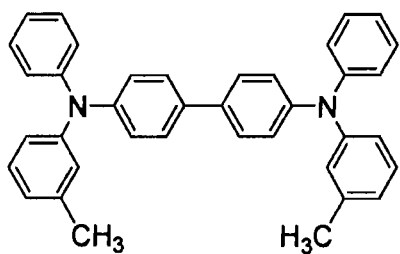
Figure 1E:
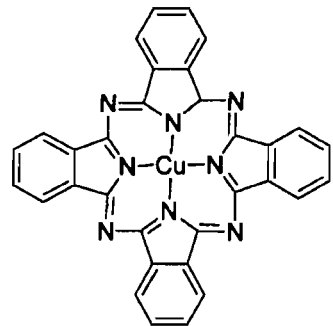
Figure 1C:
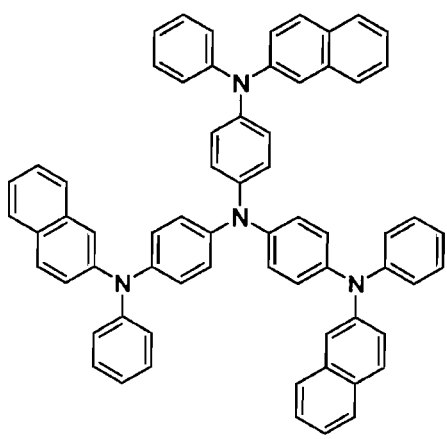

The present invention will be described below in more detail with reference to the following examples. In the following examples, alpha-NPD, TPD, 2-TNATA, alpha-6T, and CuPc were used as materials of the organic layer that was adjacent to the stack of "a molybdenum oxide layer/an ITO layer." FIG. 1A shows the structure of alpha-NPD. FIG. 1B shows the structure of TPD. FIG. 1C shows the structure of 2-TNATA. FIG. 1D shows the structure of alpha-6T. FIG. 1E shows the structure of CuPc.

Example 1

In Example 1, alpha-NPD was used to form the layer that was adjacent to the stack of "a molybdenum oxide layer/an ITO layer." First, hole injection properties of a stack in which a molybdenum oxide layer ($MoO_3$ layer) was disposed between an ITO layer and an alpha-NPD layer were evaluated.

Devices were fabricated for the purpose of evaluating the hole injection properties. Each of the devices had a layered structure of "glass/ITO layer (150 nm in thickness)/$MoO_3$ hole-injection layer/alpha-NPD hole-transport layer (100 nm in thickness)/$MoO_3$ electron-blocking layer (10 nm in thickness)/Al layer (100 nm in thickness)." Each of the fabricated devices was encapsulated together with a desiccant inside a glovebox, and the properties of the devices were evaluated without exposing them to the air. It should be noted that the $MoO_3$ layer disposed between the hole-transport layer and the Al layer is a layer for blocking the inflow of electrons from the Al layer, and is unrelated to the molybdenum oxide layer to be disposed between the anode and the organic layer.

The organic layer was formed by a vacuum deposition method at a pressure in a range of $1\times10^{-4}$ to $4\times10^{-4}$ Pa. Each of the inorganic layers (e.g., the $MoO_3$ layer) were formed by a vacuum deposition method at a pressure in a range of $1\times10^{-3}$ to $3\times10^{-3}$ Pa. The $MoO_3$ layer was formed by a vacuum deposition method using $MoO_3$ powder as the raw material. It should be noted that the oxygen contents in molybdenum oxide layers formed by vacuum deposition methods using $MoO_3$ as the raw material may be lower than that of $MoO_3$. However, since the layers formed by vapor phase deposition methods (e.g., vacuum deposition methods) using $MoO_3$ as the raw material are generally called $MoO_3$ layers (molybdenum trioxide layers), such layers are referred to as "$MoO_3$ layer" in the Examples.

The deposition rate of the $MoO_3$ layer was 0.05 nm/sec. The deposition rate of the alpha-NPD layer was 0.1 nm/sec. The deposition rate of the Al layer was 0.3 nm/sec. These deposition rates were obtained using thick films that had been formed in advance for the purpose of calculating the deposition rates.

The thicknesses of the $MoO_3$ hole-injection layers in the devices were in a range of 0 nm to 20 nm. It should be noted that "the thickness of the $MoO_3$ hole-injection layer" here is the above-mentioned "virtual thickness", and is the thickness obtained by assuming that the $MoO_3$ hole-injection layer is planarized so as to have uniform thickness and have flat surfaces. For example, the $MoO_3$ hole-injection layer having the virtual thickness of 0.25 nm was formed by a method in which the shutter of the vacuum evaporation apparatus was moved so that $MoO_3$ was deposited on the ITO layer for only 5 seconds. Since the deposition rate of $MoO_3$ was 0.05 nm/sec, the thickness would be 0.25 nm when assuming a uniform and flat layer was formed. In fact, the layer having a uniform thickness was not formed, and regions on which the $MoO_3$ layer was formed and regions on which the $MoO_3$ layer was not formed were present on the ITO layer. However, when assuming that these regions were planarized to be uniform, the thickness would be 0.25 nm. It should be noted, however, the $MoO_3$ hole-injection layer will be formed almost uniformly without openings when the thickness of the $MoO_3$ hole-injection layer is larger than a certain value.

Figure 2:
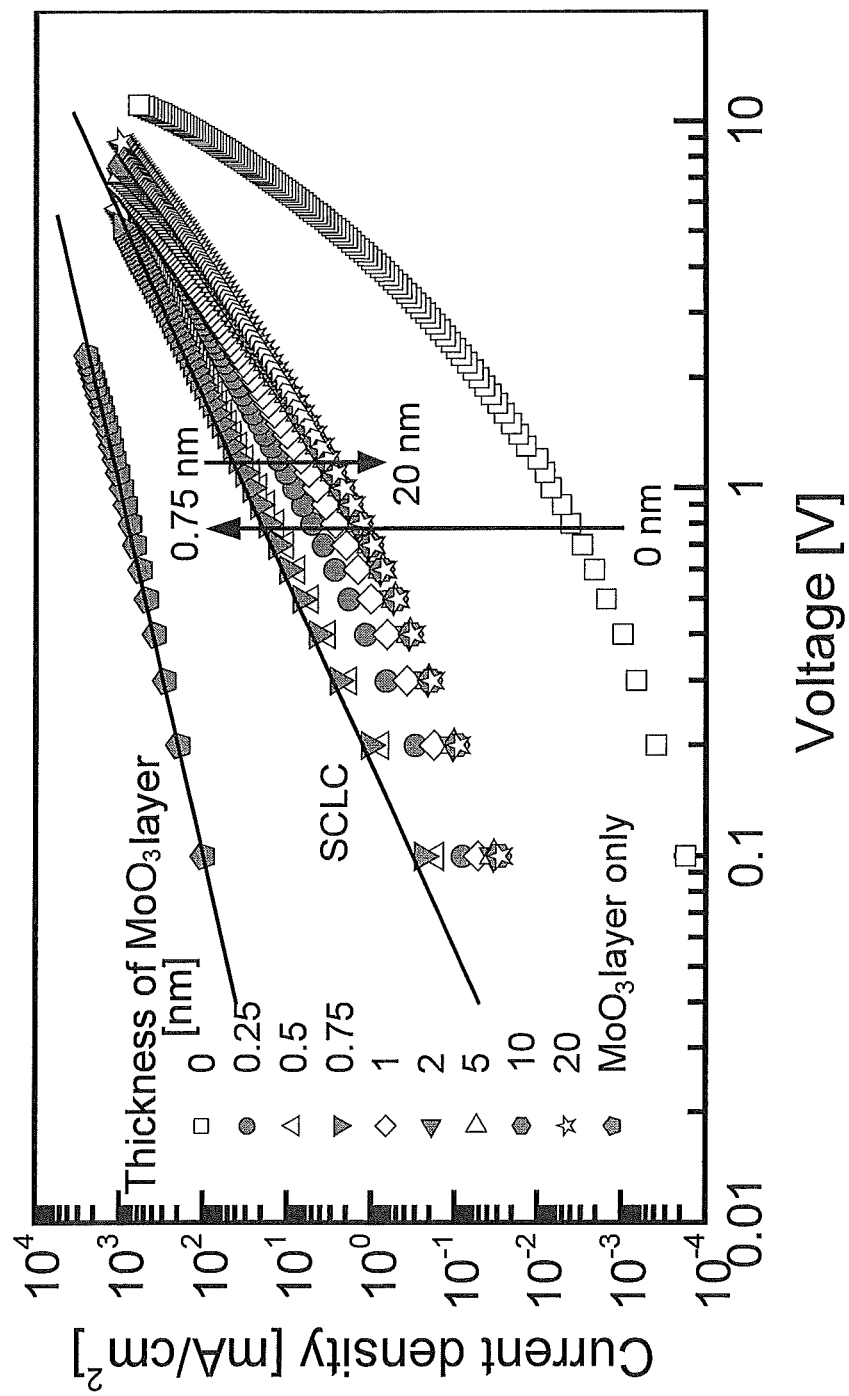
FIG. 2 is a graph showing hole injection properties in a case where a molybdenum oxide layer is disposed between an ITO layer and a hole-transport layer.

Electroluminescence was not observed when an electric current was supplied to each of the fabricated devices. This result confirmed that only holes were injected into the devices. The relationship between the current density and the voltage (J-V characteristics) of the fabricated devices was investigated. FIG. 2 shows the results. In FIG. 2, "$MoO_3$ layer only" indicates the characteristics of a $MoO_3$ layer itself, that is, the characteristics of a layered structure of "glass/ITO layer (150 nm in thickness)/$MoO_3$ layer (100 nm in thickness)/Al layer (100 nm in thickness)."

As shown in FIG. 2, when the virtual thickness of the $MoO_3$ hole-injection layer increased from 0 nm to 0.75 nm, the current density increased in accordance with the increase of the virtual thickness. In contrast, when the virtual thickness was larger than 0.75 nm, the current density decreased. When the virtual thickness of the $MoO_3$ hole-injection layer was 0.75 nm, the current density reached its maximum value, and the current density was proportional to the square of the voltage. This result suggests that the J-V characteristics were governed by a space charge limited current. This demonstrates that a junction interface without an injection barrier was formed between the ITO layer and the alpha-NPD layer with respect to the hole injection from the ITO layer to the alpha-NPD layer.

Figure 3:
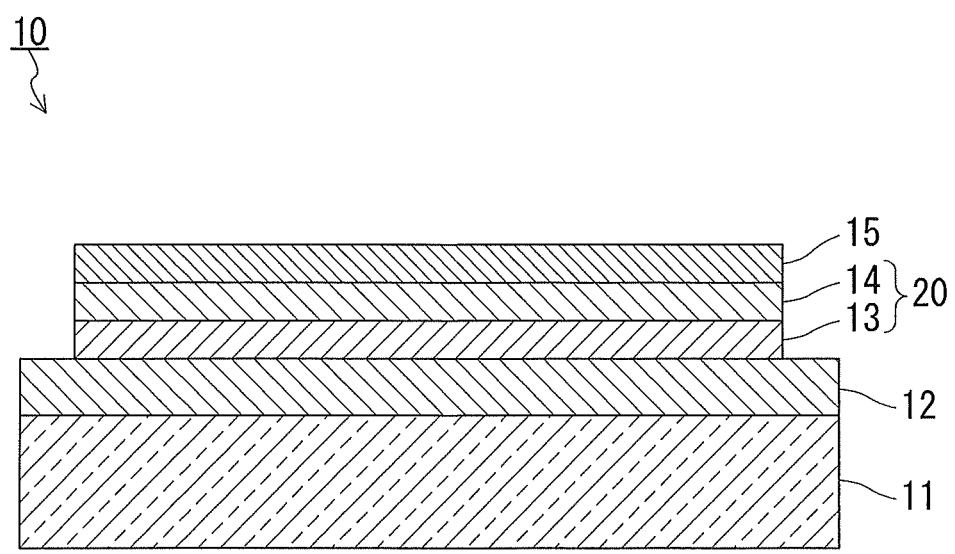
FIG. 3 schematically shows the structure of an organic EL device fabricated in Example 1.

Next, organic EL devices were fabricated and evaluated. FIG. 3 schematically shows the structure of the fabricated organic EL device 10. The organic EL device 10 included a glass substrate 11, an ITO layer 12 (150 nm in thickness), a $MoO_3$ hole-injection layer (not shown), a hole-transport layer 13 formed of alpha-NPD (60 nm in thickness), a light emitting layer 14 (65 nm in thickness), an electron-injection layer formed of LiF (not shown, 0.5 nm in thickness), and an Al layer 15 (100 nm). The hole-transport layer 13 and the light emitting layer 14 constitute an organic layer 20. The $MoO_3$ hole-injection layer was disposed between the ITO layer 12 (anode) and the hole-transport layer 13. The electron-injection layer was disposed between the light emitting layer 14 and the Al layer 15 (cathode). $Alq_3$ (8-quinolinol aluminum complex) was used to form the light emitting layer 14. The light generated in the light emitting layer 14 exited the device through the ITO layer 12 and the glass substrate 11.

Each of the organic layers and each of the inorganic layers were formed under the same conditions as those employed in fabricating the device used for evaluating the characteristics of the hole-injection layer. The deposition rate of $Alq_3$ was 0.1 nm/sec. The deposition rate of LiF was 0.01 nm/sec.

The thicknesses of the $MoO_3$ hole-injection layers in the devices were in a range of 0 nm to 20 nm. As mentioned above, "thickness of a $MoO_3$ hole-injection layer" is the thickness obtained by assuming that the $MoO_3$ hole-injection layer is planarized so as to have uniform thickness.

Figure 4:
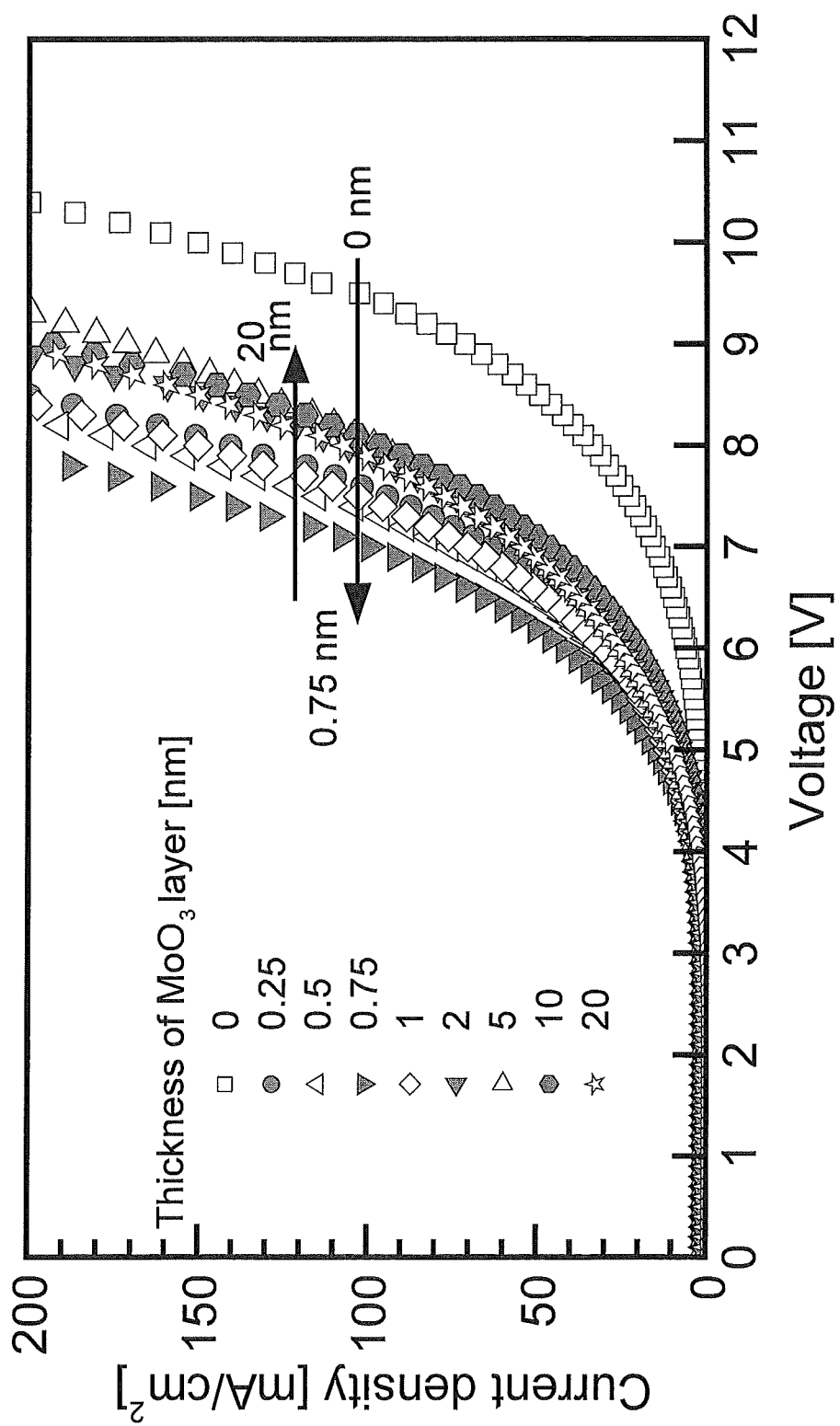
FIG. 4 is a graph showing the relationship between the drive voltage and the current density of the organic EL devices fabricated in Example 1.

The J-V characteristics of the fabricated organic EL devices were measured. FIG. 4 shows the measured J-V characteristics. The drive voltage corresponding to a specific current density was the lowest when the thickness of the $MoO_3$ hole-injection layer was 0.75 nm. The use of the $MoO_3$ hole-injection layer having a thickness of 0.75 nm reduced the drive voltage by about 30% from that of the device without the $MoO_3$ hole-injection layer.

Figure 5:
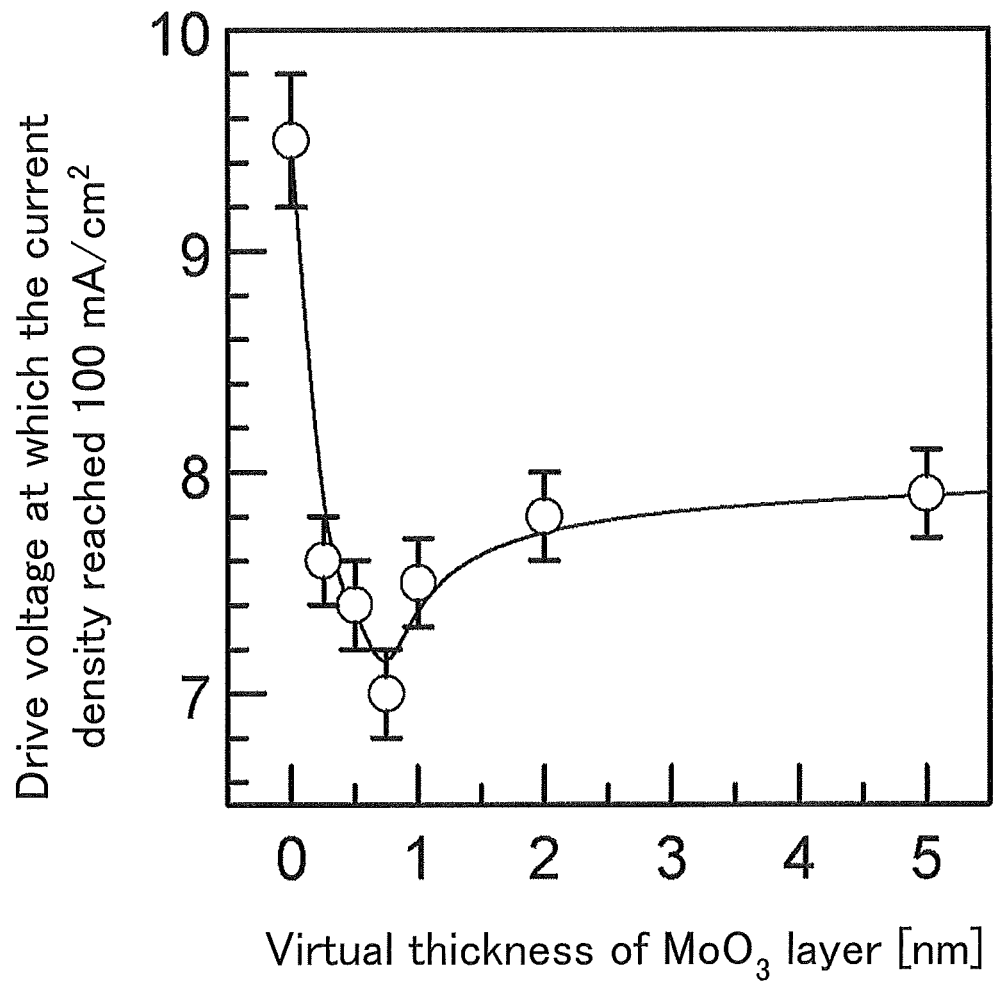
FIG. 5 is a graph showing the relationship between the thickness of a $MoO_3$ layer and the drive voltage of the organic EL devices fabricated in Example 1.

FIG. 5 shows the relationship between the virtual thickness of the $MoO_3$ hole-injection layer and the drive voltage at which the current density reached 100 $mA/cm^2$. As shown in FIG. 5, the drive voltage was low when the virtual thickness of the $MoO_3$ hole-injection layer was not less than 0.25 nm and less than 2 nm. The drive voltage became lower when the virtual thickness was in a range of 0.25 nm to 1 nm. The drive voltage became even lower when the virtual thickness was in a range of 0.5 nm to 1 nm.

Figure 6:
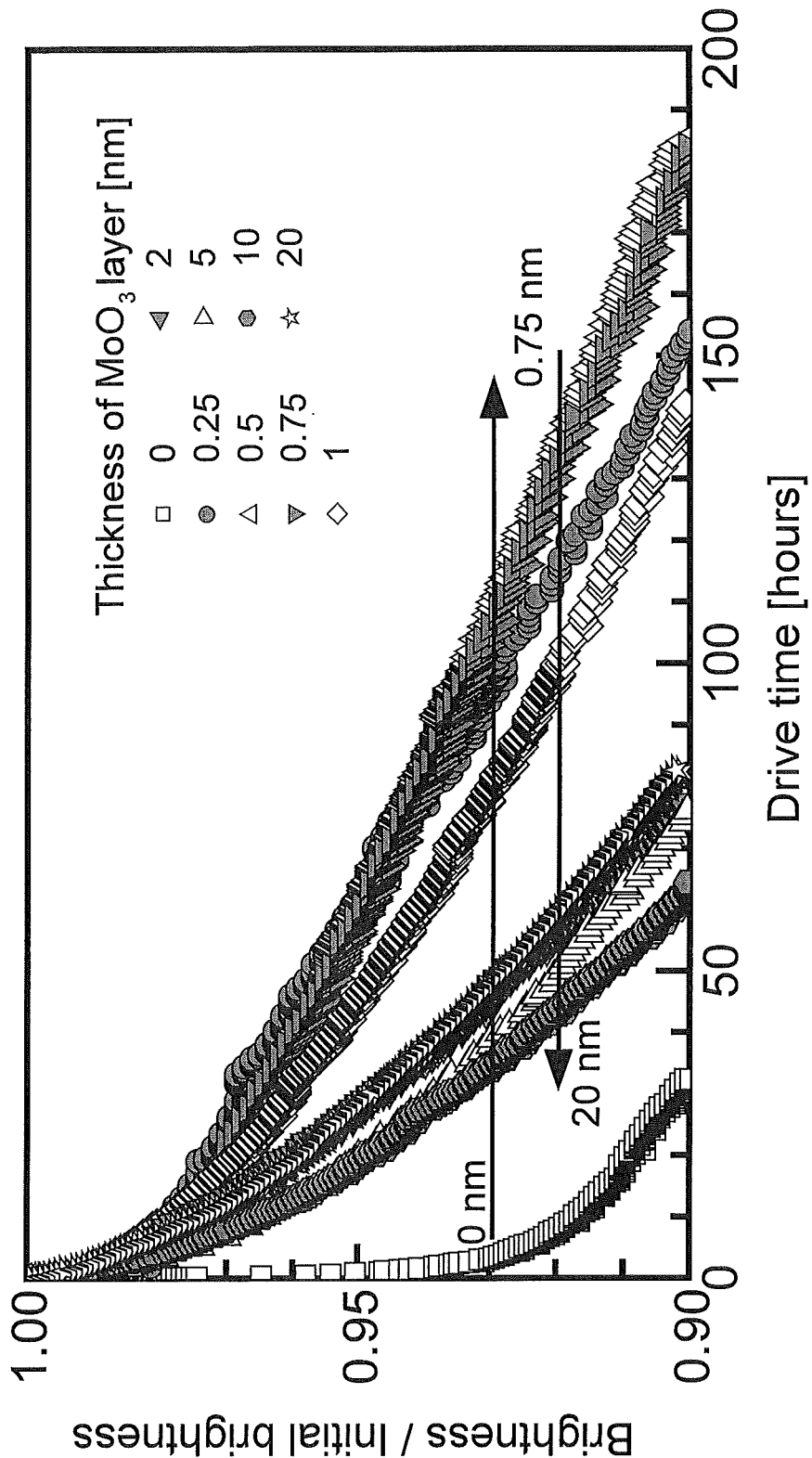
FIG. 6 is a graph showing the relationship between the drive time and the brightness change of the organic EL devices fabricated in Example 1.

The fabricated organic EL devices were driven with a constant current of 50 $mA/cm^2$, and their life characteristics were evaluated. FIG. 6 shows the evaluation result. The horizontal axis of FIG. 6 indicates the drive time. The vertical axis indicates the brightness maintenance rate represented by the percentage of the initial brightness.

Figure 7:
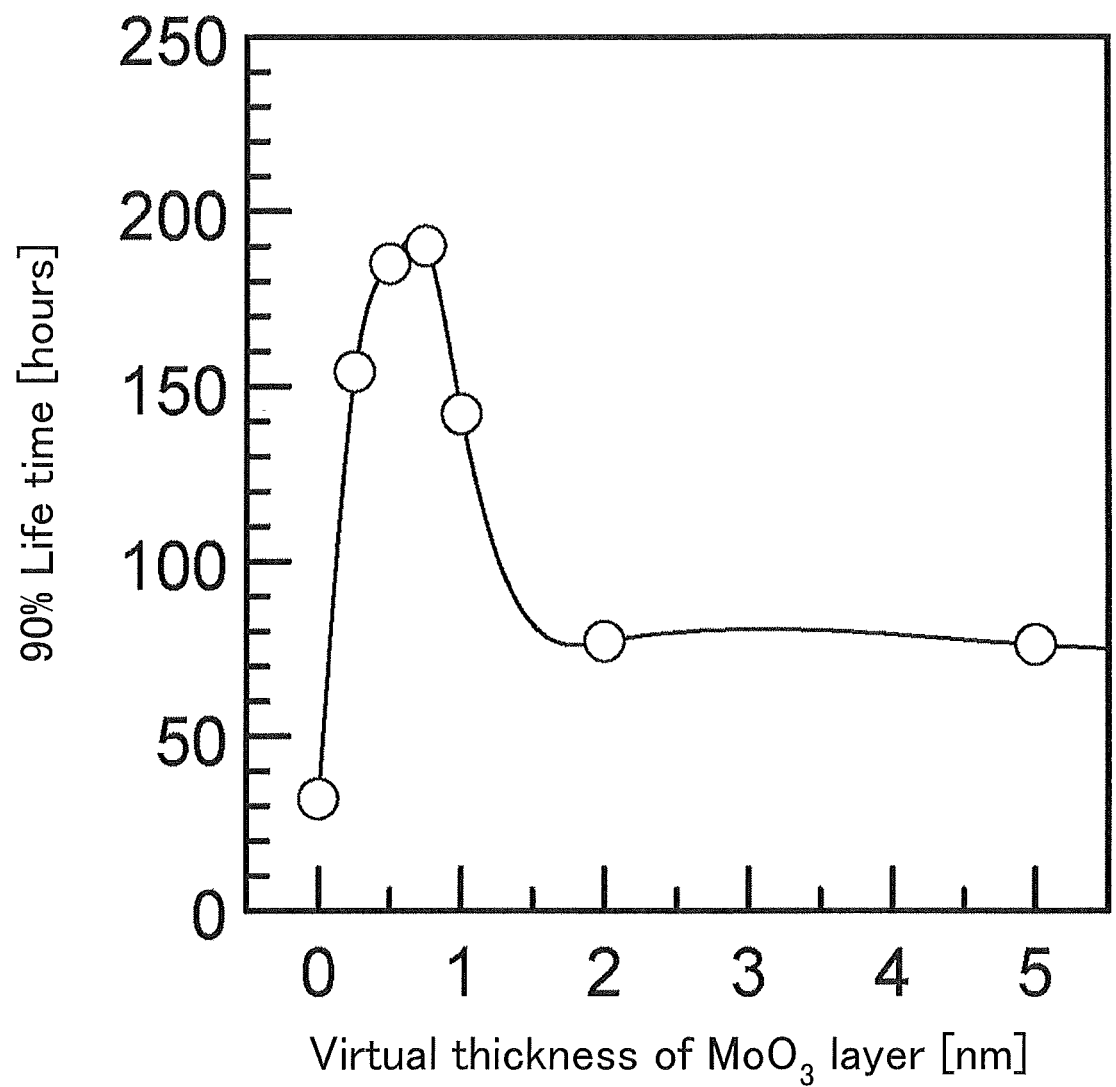
FIG. 7 is a graph showing the relationship between the thickness of a $MoO_3$ layer and the drive time required for the brightness to reach 90% of the initial brightness of the organic EL devices fabricated in Example 1.

FIG. 7 shows the relationship between the virtual thickness of the $MoO_3$ hole-injection layer and "drive time $T_{90}$" that indicates the drive time at which the brightness reached 90% of the initial brightness. As shown in FIG. 7, the drive time $T_{90}$ became longer when the virtual thickness of the $MoO_3$ hole-injection layer was not less than 0.25 nm and less than 2 nm. The drive time $T_{90}$ became even longer when the virtual thickness was in a range of 0.25 nm to 1 nm. When the virtual thickness of the $MoO_3$ hole-injection layer was in a range of 0.25 nm to 1 nm, the drive time $T_{90}$ was about twice as long as that of the devices whose $MoO_3$ hole-injection layers had the virtual thickness of 2 nm or more. Under the conditions of the evaluation, the life was the longest when the virtual thickness of the $MoO_3$ hole-injection layer was 0.75 nm.

When the virtual thickness of the $MoO_3$ hole-injection layer was more than 2 nm, the characteristics (the drive voltage and the life) of the organic EL device deteriorate.

Example 2

In Example 2, devices each having a layered structure of "glass/ITO layer (150 nm in thickness)/$MoO_3$ layer/TPD layer (40 nm)/alpha-NPD layer (50 nm in thickness)/$Alq_3$ layer (70 nm)/LiF layer (0.5 nm)/Al layer (100 nm in thickness)" were fabricated. Each of the organic layers was formed by a vacuum deposition method at a pressure in a range of $1 \times 10^{-4}$ to $4 \times 10^{-4}$ Pa. Each of the inorganic layers were formed by a vacuum deposition method at a pressure in a range of $1 \times 10^{-4}$ to $3 \times 10^{-3}$ Pa. The $MoO_3$ layer was fabricated in the same manner as described in Example 1. The virtual thicknesses of the $MoO_3$ layers in the devices were 0 nm, 0.5 nm, and 10 nm. Table 1 shows the evaluation results of the fabricated devices.

TABLE 1

| Virtual thickness of the $MoO_3$ layer [nm] | Drive voltage [V] | Brightness [$cd/m^2$] | External quantum efficiency [%] | Drive time $T_{92}$ [hours] |
|---|---|---|---|---|
| 0 | 13.2 ± 0.5 | 2153 ± 298 | 1.17 ± 0.02 | 1.3 |
| 0.5 | 7.3 ± 0.2 | 1396 ± 78 | 0.83 ± 0.01 | 163 |
| 10 | 7.7 ± 0.1 | 1439 ± 100 | 0.86 ± 0.01 | 74.5 |

Figure 8:
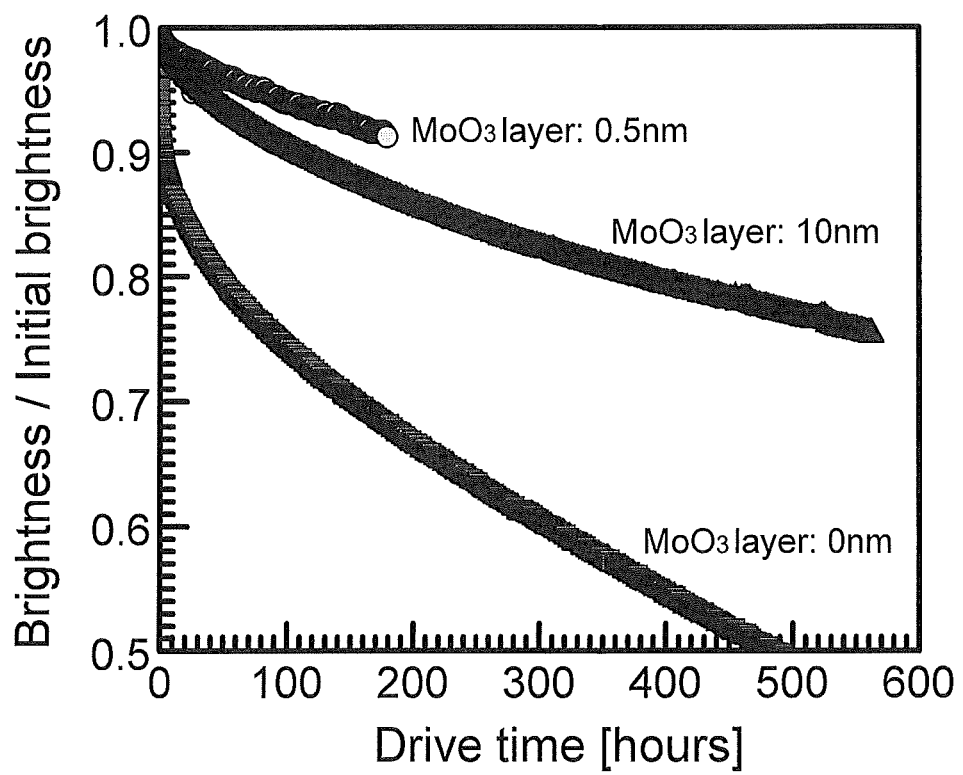
FIG. 8 is a graph showing the relationship between the drive time and the brightness change of the organic EL devices fabricated in Example 2.

"Drive voltage," "Brightness," and "External quantum efficiency" in Table 1 were obtained under a condition where the current density was 50 $mA/cm^2$. "Drive time $T_{92}$" indicates the drive time at which the brightness reached 92% of the initial brightness while the devices were driven to emit light with a current density of 50 $mA/cm^2$. FIG. 8 shows the relationship between the drive time and the brightness maintenance rate under a condition where the devices were driven to emit light with a current density of 50 $mA/cm^2$.

As shown in Table 1, the drive voltage was low when the virtual thickness of the $MoO_3$ layer was 0.5 nm. Moreover, the drive time $T_{92}$ of the device including the $MoO_3$ layer having the virtual thickness of 0.5 nm was at least 100 times as long as that of the device without the $MoO_3$ layer, and was at least twice as long as that of the device including the $MoO_3$ layer having the virtual thickness of 10 nm. Moreover, a continuation of the life test showed that "Drive time $T_{87}$" indicating the drive time at which the brightness reached 87% of the initial brightness was 9.5 hours when the virtual thickness of the $MoO_3$ layer was 0 nm, and was 348 hours when the virtual thickness of the $MoO_3$ layer was 0.5 nm, and was 172 hours when the virtual thickness of the $MoO_3$ layer was 10 nm.

Example 3

In Example 3, devices each having a layered structure of "glass/ITO layer (150 nm in thickness)/$MoO_3$ layer/2-TNATA layer (40 nm)/alpha-NPD layer (50 nm in thickness)/$Alq_3$ layer (70 nm)/LiF layer (0.5 nm)/Al layer (100 nm in thickness)" were fabricated. Each of the layers was formed in the same manner as described in Example 2. The virtual thicknesses of the $MoO_3$ layers in the devices were 0 nm, 0.75 nm, and 10 nm. Table 2 shows the evaluation results of the fabricated devices.

TABLE 2

| Virtual thickness of the $MoO_3$ layer [nm] | Drive voltage [V] | Brightness [$cd/m^2$] | External quantum efficiency [%] | Drive time $T_{73}$ [hours] |
|---|---|---|---|---|
| 0 | 10.4 ± 0.1 | 1689 ± 77 | 1.00 ± 0.02 | 81.4 |
| 0.75 | 10.2 ± 0.2 | 1821 ± 217 | 1.00 ± 0.03 | 316 |
| 10 | 10.1 ± 0.1 | 1864 ± 221 | 1.01 ± 0.02 | 179 |

Figure 9:
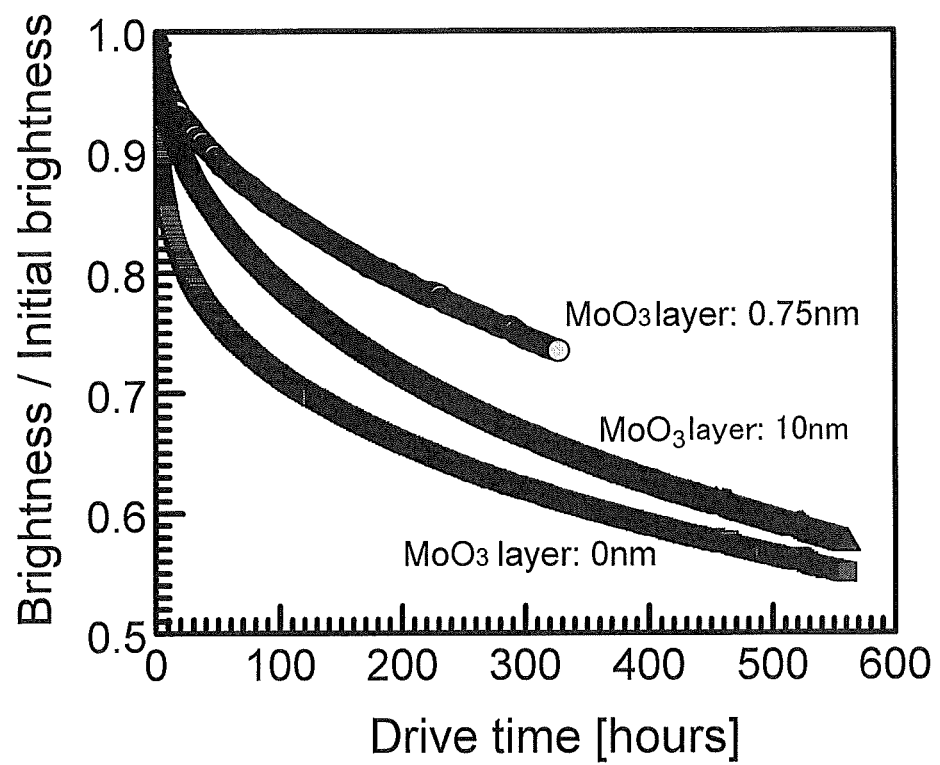
FIG. 9 is a graph showing the relationship between the drive time and the brightness change of the organic EL devices fabricated in Example 3.

"Drive voltage," "Brightness," and "External quantum efficiency" in Table 2 were obtained under a condition where the current density was 50 $mA/cm^2$. "Drive time $T_{73}$" indicates the drive time at which the brightness reached 73% of the initial brightness while the devices were driven to emit light with a current density of 50 $mA/cm^2$. FIG. 9 shows the relationship between the drive time and the brightness maintenance rate under a condition where the devices were driven to emit light with a current density of 50 $mA/cm^2$.

As shown in Table 2, the drive time $T_{73}$ of the device including the $MoO_3$ layer having the virtual thickness of 0.75 nm was about 4 times as long as that of the device without the MoO$_3$ layer, and 1.8 times as long as that of the device including the MoO$_3$ layer having a thickness of 10 nm. Moreover, a continuation of the life test showed that "Drive time T$_{66}$" indicating the drive time at which the brightness reached 66% of the initial brightness was 198 hours when the virtual thickness of the MoO$_3$ layer was 0 nm, and was 516 hours when the virtual thickness of the MoO$_3$ layer was 0.75 nm, and was 334 hours when the virtual thickness of the MoO$_3$ layer was 10 nm.

Example 4

In Example 4, devices each having a layered structure of "glass/ITO layer (150 nm in thickness)/MoO$_3$ layer/alpha-6T layer (40 nm)/alpha-NPD layer (50 nm in thickness)/Alq$_3$ layer (70 nm)/LiF layer (0.5 nm)/Al layer (100 nm in thickness)" were fabricated. Each of the layers was formed in the same manner as described in Example 2. The virtual thicknesses of the MoO$_3$ layers in the devices were 0 nm, 0.75 nm, and 10 nm. Table 3 shows the evaluation results of the fabricated devices.

TABLE 3

| Virtual thickness of the MoO$_3$ layer [nm] | Drive voltage [V] | Brightness [cd/m$^2$] | External quantum efficiency [%] | Drive time T$_{85}$ [hours] |
| --- | --- | --- | --- | --- |
| 0 | 7.7 ± 0.2 | 1346 ± 70 | 0.86 ± 0.02 | 109 |
| 0.75 | 7.7 ± 0.1 | 1350 ± 61 | 0.90 ± 0.04 | 213 |
| 10 | 7.7 ± 0.2 | 1395 ± 141 | 0.87 ± 0.02 | 177 |

Figure 10:
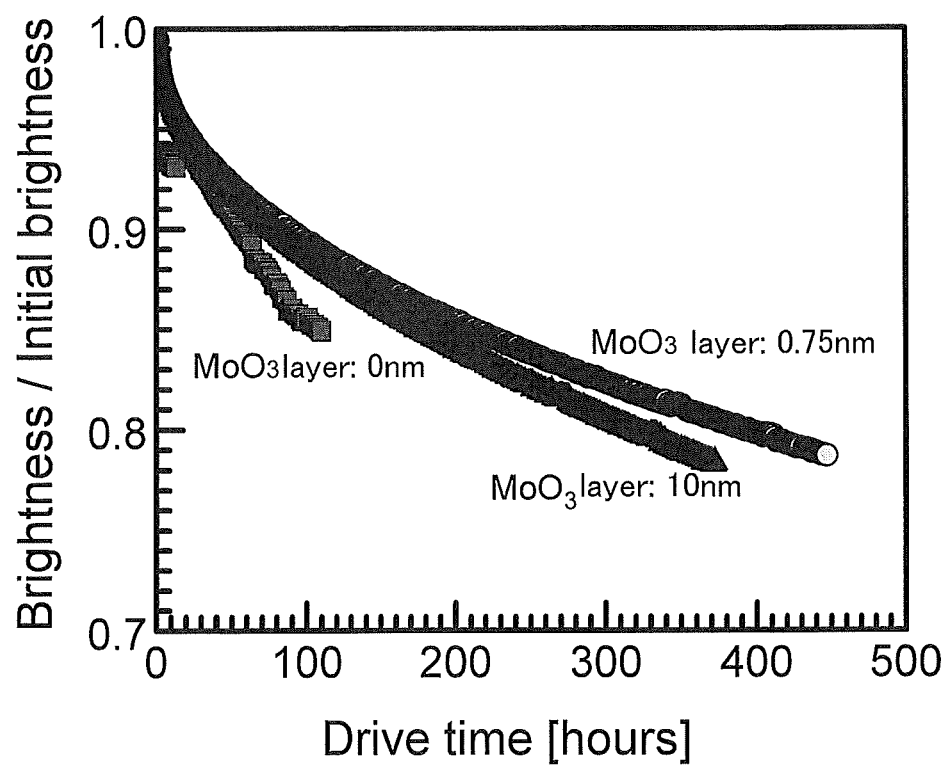
FIG. 10 is a graph showing the relationship between the drive time and the brightness change of the organic EL devices fabricated in Example 4.

"Drive voltage," "Brightness," and "External quantum efficiency" in Table 3 were obtained under a condition where the current density was 50 mA/cm$^2$. "Drive time T$_{85}$" indicates the drive time at which the brightness reached 85% of the initial brightness while the devices were driven to emit light with a current density of 50 mA/cm$^2$. FIG. 10 shows the relationship between the drive time and the brightness maintenance rate under a condition where the devices were driven to emit light with a current density of 50 mA/cm$^2$.

As shown in Table 3, the drive time T$_{85}$ of the device including the MoO$_3$ layer having the virtual thickness of 0.75 nm was about twice as long as that of the device without the MoO$_3$ layer. Moreover, a continuation of the life test showed that "Drive time T$_{75}$" indicating the drive time at which the brightness reached 75% of the initial brightness was 304 hours when the virtual thickness of the MoO$_3$ layer was 0 nm, and was 630 hours when the virtual thickness of the MoO$_3$ layer was 0.75 nm, and was 500 hours when the virtual thickness of the MoO$_3$ layer was 10 nm.

Example 5

In Example 5, devices each having a layered structure of "glass/ITO layer (150 nm in thickness)/MoO$_3$ layer/CuPc layer (40 nm)/alpha-NPD layer (50 nm in thickness)/Alq$_3$ layer (70 nm)/LiF layer (0.5 nm)/Al layer (100 nm in thickness)" were fabricated. Each of the layers was formed in the same manner as described in Example 2. The virtual thicknesses of the MoO$_3$ layers in the devices were 0 nm, 0.75 nm, and 10 nm. Table 4 shows the evaluation results of the fabricated devices.

TABLE 4

| Virtual thickness of the MoO$_3$ layer [nm] | Drive voltage [V] | Brightness [cd/m$^2$] | External quantum efficiency [%] | Drive time T$_{76}$ [hours] |
| --- | --- | --- | --- | --- |
| 0 | 8.8 ± 0.2 | 1110 ± 89 | 0.71 ± 0.01 | 386 |
| 0.75 | 8.8 ± 0.3 | 1230 ± 129 | 0.71 ± 0.01 | 609 |
| 10 | 8.6 ± 0.2 | 1258 ± 114 | 0.72 ± 0.02 | 506 |

"Drive voltage," "Brightness," and "External quantum efficiency" in Table 4 were obtained under a condition where the current density was 50 mA/cm$^2$. "Drive time T$_{76}$" indicates the drive time at which the brightness reached 76% of the initial brightness while the devices were driven to emit light with a current density of 50 mA/cm$^2$.

As shown in Table 4, the drive time T$_{76}$ of the device including the MoO$_3$ layer having the virtual thickness of 0.75 nm was about 1.6 times as long as that of the device without the MoO$_3$ layer.

As shown in the above Examples, the present invention enables the organic EL devices to have longer life. Moreover, the present invention enables the drive voltages of the organic EL devices to be lowered.

[Observation of MoO$_3$ Layers on ITO Layers]

Layered samples each including a MoO$_3$ layer formed an ITO layer were fabricated, and the surface morphologies thereof were observed using an atomic force microscope (AFM). Moreover, the average surface roughness of each of the samples was measured. The virtual thicknesses of the MoO$_3$ layers in the samples were 0.75 nm, 1.0 nm, and 3.0 nm.

Figure 11A:
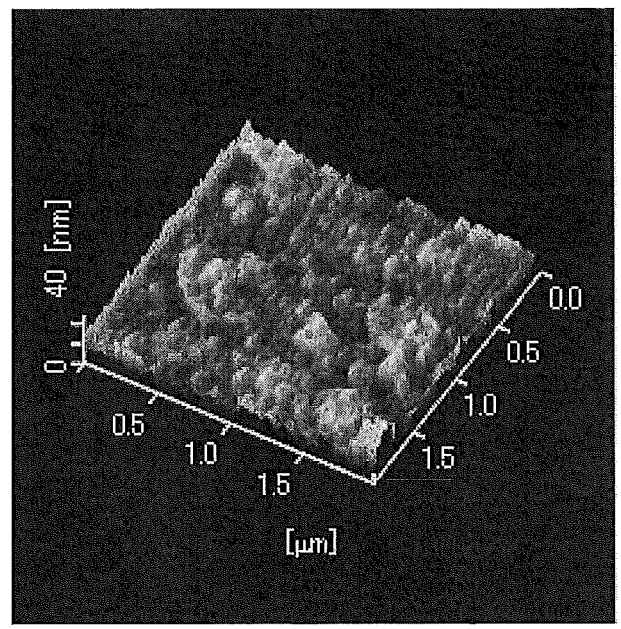
FIG. 11A is an AFM image showing the surface of an ITO layer.
Figure 11A:
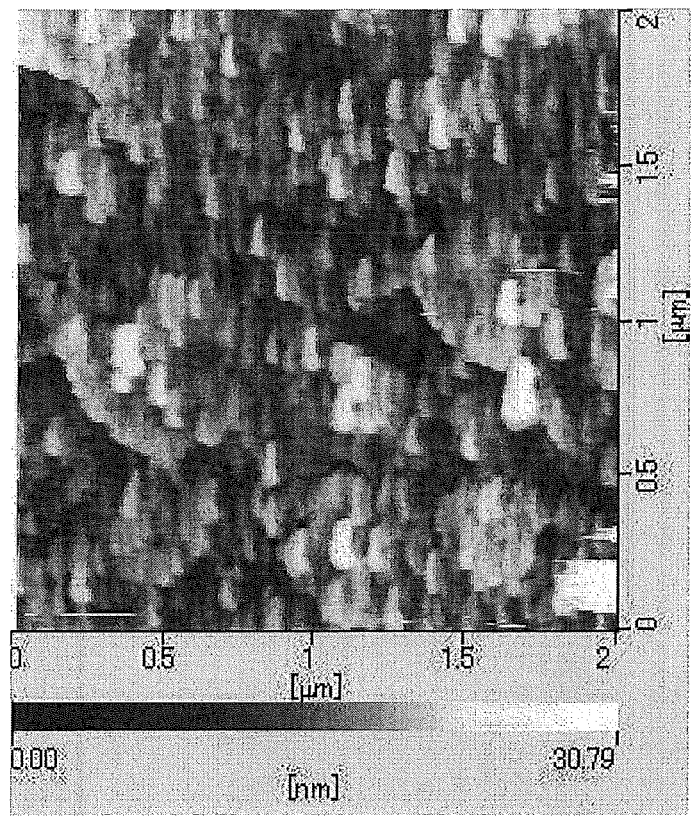

FIG. 11A is an AFM image showing the surface of an ITO layer on which the MoO$_3$ layer was not formed. When the MoO$_3$ layer was not formed, the surface roughness was large, and the average surface roughness was 3.68 nm.

Figure 11B:
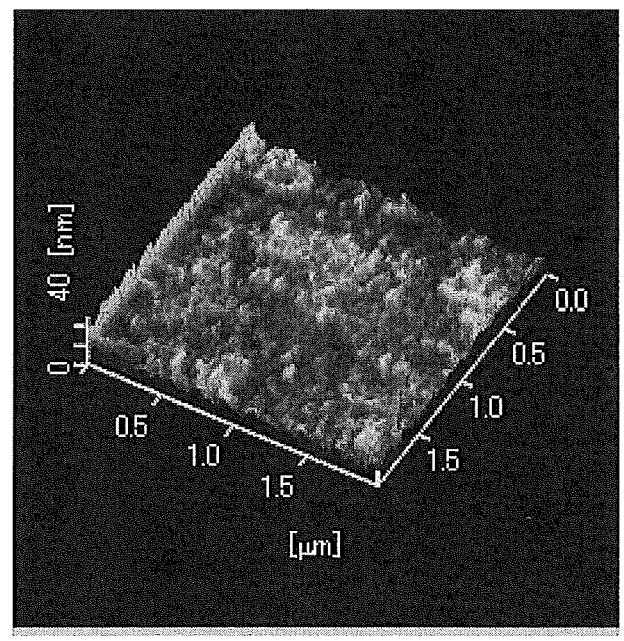
FIG. 11B is an AFM image showing the surface of the layered structure of "an ITO layer/a $MoO_3$ layer (the virtual thickness: 0.75 nm)."
Figure 11B:
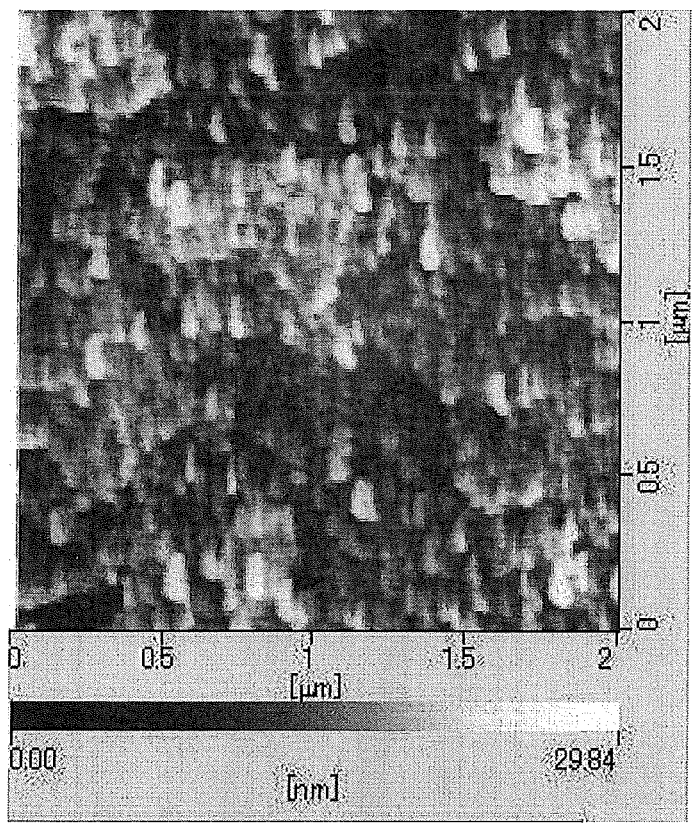

FIG. 11B is an AFM image showing the surface of the layered structure of "an ITO layer/a MoO$_3$ layer (virtual thickness: 0.75 nm)." Since the MoO$_3$ layer having the virtual thickness of 0.75 nm was formed, the surface roughness decreased. However, the roughness believed to originate from the ITO layer was still observed in the surface. This observation suggests that the MoO$_3$ layer was formed nonuniformly. The average surface roughness was 2.99 nm.

Figure 11C:
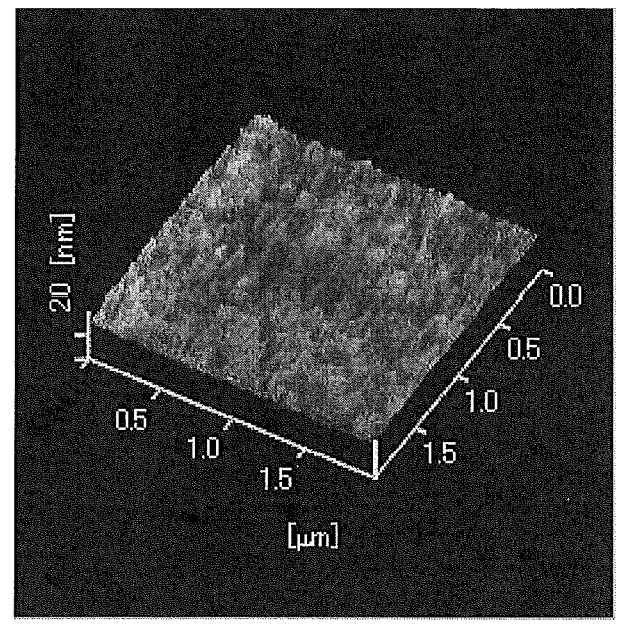
FIG. 11C is an AFM image showing the surface of the layered structure of "an ITO layer/a $MoO_3$ layer (the virtual thickness: 1.0 nm)."
Figure 11C:
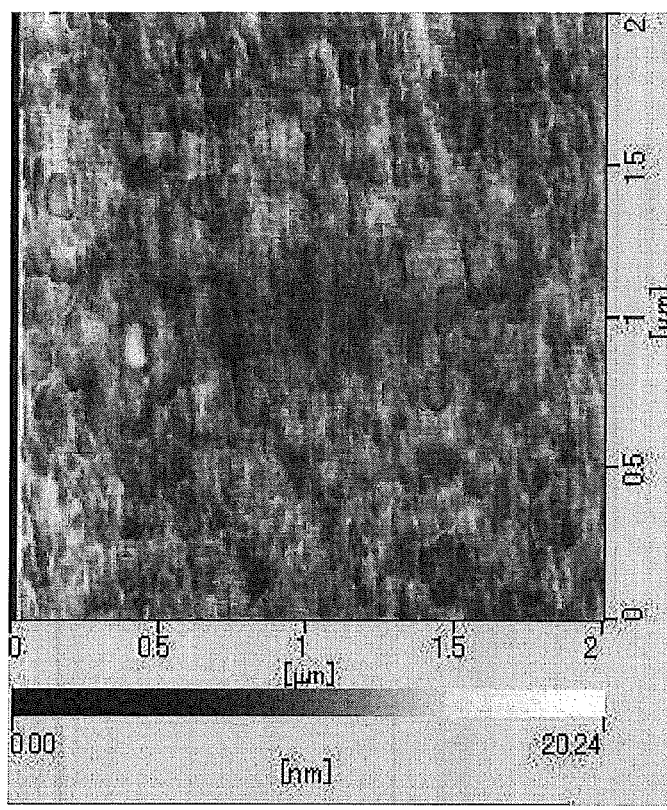

FIG. 11C is an AFM image showing the surface of the layered structure of "an ITO layer/a MoO$_3$ layer (virtual thickness: 1.0 nm)." Since the MoO$_3$ layer having the virtual thickness of 1.0 nm was formed, the surface roughness became smaller than that in FIG. 11B. However, the roughness believed to originate from the ITO layer was still observed in the surface. This observation suggests that the MoO$_3$ layer was formed nonuniformly. The average surface roughness was 1.67 nm.

Figure 11D:
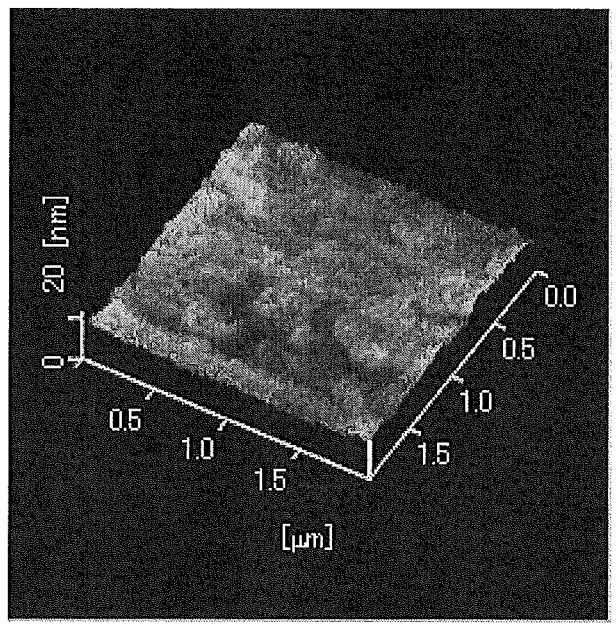
FIG. 11D is an AFM image showing the surface of the layered structure of "an ITO layer/a MoO$_3$ layer (the virtual thickness: 3.0 nm)."
Figure 11D:
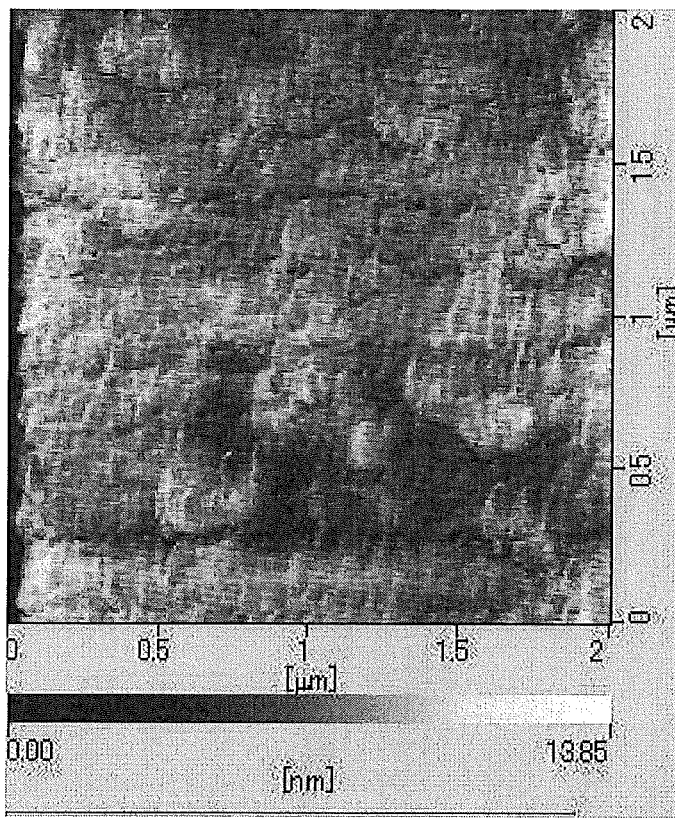

FIG. 11D is an AFM image showing the surface of the layered structure of "an ITO layer/a MoO$_3$ layer (virtual thickness: 3.0 nm)." Since the MoO$_3$ layer having the virtual thickness of 3.0 nm was formed, the surface roughness became smaller, and there was almost no roughness believed to originate from the ITO layer. This observation suggests that the MoO$_3$ layer formed on the ITO layer covered the entire surface of the ITO layer. The average surface roughness of the layered structure of "an ITO layer/a MoO$_3$ layer (virtual thickness: 3.0 nm)" was 1.17 nm.

The present invention can be applied to other embodiments unless the present invention departs from its intention and essential features. The embodiments disclosed in this specification are explanatory in all senses and do not limit the present invention. The scope of the present invention is represented not by the above explanation but by accompanying claims, and encompasses all modifications which have a meaning and scope equivalent to the claims.

Industrial Applicability

The present invention can be applied to organic EL devices. The organic EL device of the present invention has the advantage that it can have a much longer life than conventional organic EL devices. Longer lives of organic EL devices have been an object of study for many years. The present invention, therefore, will dramatically affect the industry using organic EL devices. The present invention preferably is applied to, for example, display panels using organic EL devices.

The invention claimed is:

1. An organic EL device comprising:
a transparent anode;
a cathode; and
an organic layer, the organic layer being disposed between the anode and the cathode and including a light emitting layer, wherein
at least one side of the anode nearer to the organic layer is formed of a transparent oxide semiconductor layer,
a molybdenum oxide layer is disposed between the oxide semiconductor layer and the organic layer,
the thickness of the molybdenum oxide layer is less than 2 nm when the thickness is calculated in terms of a uniform thickness,
the molybdenum oxide layer is formed nonuniformly at the interface between the oxide semiconductor layer and the organic layer so that the oxide semiconductor layer is partially in contact with the organic layer, and
light generated in the light emitting layer is emitted through the transparent anode.

2. The organic EL device according to claim 1, wherein the oxide semiconductor layer is an ITO layer.

3. The organic EL device according to claim 1, wherein the organic layer includes a layer that is nearest to the anode among layers constituting the organic layer and that is formed of any one selected from the group consisting of alpha-NPD, TPD, 2-TNATA, alpha-6T, and CuPc.

4. The organic EL device according to claim 1, wherein when the molybdenum oxide layer is assumed to have a uniform thickness, the thickness of the molybdenum oxide layer is not less than 0.25 nm and less than 2 nm.

5. The organic EL device according to claim 1, wherein when the molybdenum oxide layer is assumed to have a uniform thickness, the thickness of the molybdenum oxide layer is not less than 0.25 nm and not more than 1 nm.

6. The organic EL device according to claim 1, further comprising a transparent substrate, wherein the anode including the transparent oxide semiconductor layer, the molybdenum oxide layer, the organic layer, and the cathode are stacked in this order on the transparent substrate, and the light generated in the light emitting layer is emitted through the transparent anode and the transparent substrate.

* * * * *